United States Patent
Yum et al.

(10) Patent No.: US 7,224,222 B2
(45) Date of Patent: May 29, 2007

(54) HIGH EFFICIENCY LINEAR RF AMPLIFIER

(76) Inventors: Tsz Yin Yum, City University of Hong Kong, Tat Chee Avenue, Kowloon (HK); Quan Xue, City University of Hong Kong, Tat Chee Avenue, Kowloon (HK); Chi Hou Chan, City University of Hong Kong, Tat Chee Avenue, Kowloon (HK)

( * ) Notice: Subject to any disclaimer, the term of this patent is extended or adjusted under 35 U.S.C. 154(b) by 0 days.

(21) Appl. No.: 11/028,496

(22) Filed: Jan. 3, 2005

(65) Prior Publication Data
US 2006/0145760 A1    Jul. 6, 2006

(51) Int. Cl.
*H03F 1/26* (2006.01)
(52) U.S. Cl. ..................................................... 330/149
(58) Field of Classification Search ............ 330/85–86, 330/278, 282, 290–293, 149, 285
See application file for complete search history.

(56) References Cited

U.S. PATENT DOCUMENTS 6,667,657 B2 * 12/2003 Nakatani et al. ............... 330/51
6,882,226 B2 * 4/2005 Cho et al. .................... 330/282

* cited by examiner

*Primary Examiner*—Benny Lee
*Assistant Examiner*—Hieu Nguyen
(74) *Attorney, Agent, or Firm*—Heslin Rothenberg Farley & Mesiti P.C.

(57) ABSTRACT

An amplifier comprises a first transistor for providing signal amplification, and a second transistor for providing distortion compensation, wherein said second transistor is capable of simultaneously providing more than one form of distortion compensation. A first signal path passes through a first transistor to provide signal gain, and a second signal path passes through a second transistor to provide distortion compensation. The amplifier is capable of providing pre-distortion compensation, post-distortion compensation and cubic-polynomial distortion compensation.

12 Claims, 8 Drawing Sheets

HIGH EFFICIENCY LINEAR RF AMPLIFIER

FIELD OF THE INVENTION

This invention relates to a RF amplifier, and in particular to a linear RF amplifier with high efficiency for example for use in mobile communications equipment.

BACKGROUND OF THE INVENTION

The RF amplifier is an important component of a mobile communications handset such as a mobile phone. The increasing popularity of mobile phones, and the developments in the industry, such as the provision of multiple functions in mobile phones and the ever increasing number of subscribers, places great demands on the design of the mobile phone.

Key design features in a RF amplifier for a mobile phone are power consumption and linearization. In particular, battery power and battery life is a constant issue in mobile phones and power-effective solutions are constantly needed. This is particularly so with the incorporation into mobile phones of other functions such as cameras and the use of large LCD displays. The incorporation of these other functions and features into mobile phones also places great demands on space on the printed circuit board. Furthermore, the linearity of the input-output characteristics of the RF amplifier is very important to minimize adjacent channel interference (which can cause crosstalk in cellular networks). The ideal RF amplifier in a mobile phone would therefore be highly efficient, power effective, with good linearity characteristics, and would occupy minimum space on the printed circuit board. Often, however, there is a trade-off between linearity and power efficiency.

FIG. 1 shows a conventional RF amplifier circuit. Under large signal conditions, the base-emitter voltage ($V_{BE}$) of the transistor will drop with the increase in the rectified DC current and the decrease of the transconductance resulting in severe non-linear distortion in signal amplitude.

Various linearization techniques have been proposed to overcome or mitigate this problem. These include harmonic feedback, feed-forward, base-band feed-forward, and pre-distortion techniques. Each of these prior techniques has its own advantages and disadvantages.

For example, generally speaking, harmonic feedback from the output port can reduce intermodulation distortion (IMD) products by the order of 20 dB, but it can also cause serious gain reduction and instability problems.

Feed-forward linearization provides good distortion improvement and broadband operation, but requires complex, bulky and expensive control circuits which prevent the full use of active devices and limits the use if this technique to the base-station level. Even after a number of years of development the typical efficiency of feed-forward techniques is only about 8% at best and this figure is unlikely to be improved upon in the near future.

Pre-distortion techniques can achieve a much higher efficiency of about 15% and linearization using series or parallel diode pre-distorters offers a relatively compact and low-cost approach to improving the linearity of the RF amplifier. However, a suitable match of the non-linear transfer characteristics from the pre-distorters is always required and in practice limits the degree of cancellation to below 10 dB.

More recently several methods have been proposed based on the exploitation of second-order signals. These techniques are based on an additional injection of either the second-order harmonic or difference frequency signals to interact with the fundamentals and can give more than 25 dB in cancellation. However, precise gain and phase adjustments are still required which can make these approaches impractical. In addition, since auxiliary predistortion circuitry is needed there is an increase in complexity and a reduction in efficiency.

SUMMARY OF THE INVENTION

According to the present invention there is provided an amplifier comprising a first transistor for providing signal amplification, and a second transistor for providing distortion compensation, wherein said second transistor is capable of simultaneously providing more than one form of distortion compensation.

Preferably the second transistor is adapted to provide pre-distortion compensation, post-distortion compensation, and cubic-polynomial compensation. In one preferred arrangement, for example, a first junction of the second transistor is used to provide the pre-distortion compensation, a second junction of the transistor is used to provide the post-distortion compensation, and a third junction of the transistor is used to provide the cubic-polynomial compensation.

The pre-distortion compensation may provided by connecting a first junction of the second transistor to the input to the first transistor whereby a voltage drop at a junction of the first transistor is compensated for by a corresponding voltage drop in the first junction of the second transistor. The post-distortion compensation may be provided by connecting a second junction of the second transistor to the output of the first transistor.

In embodiments of the present invention a first signal path passes through the first transistor and a second signal path passes through the collector-emitter junction of the second transistor, and the cubic-polynomial distortion compensation is provided by selecting the phase and amplitude of the second signal path such that third-order distortion products of the signal path are substantially equal in magnitude and opposite in phase to third-order distortion products of the first signal path.

Preferably the amplifier further comprises a power management control circuit adapted to select a bias voltage for the amplifier in accordance with an anticipated output power. The power management control circuit preferably identifies whether the amplifier is operating in a low power mode, a medium power mode, or a high power mode and adjusts the bias voltage in accordance with the identified operating mode.

According to another aspect of the invention there is provided an amplifier comprising a first signal path and a second signal path, wherein said first signal path passes through a first transistor to provide signal gain, and wherein the second signal path passes through a second transistor to provide distortion compensation.

BRIEF DESCRIPTION OF THE DRAWINGS

Some embodiments of the invention will now be described by way of example and with reference to the accompanying drawings, in which.

DETAILED DESCRIPTION OF PREFERRED EMBODIMENTS

Figure 1:
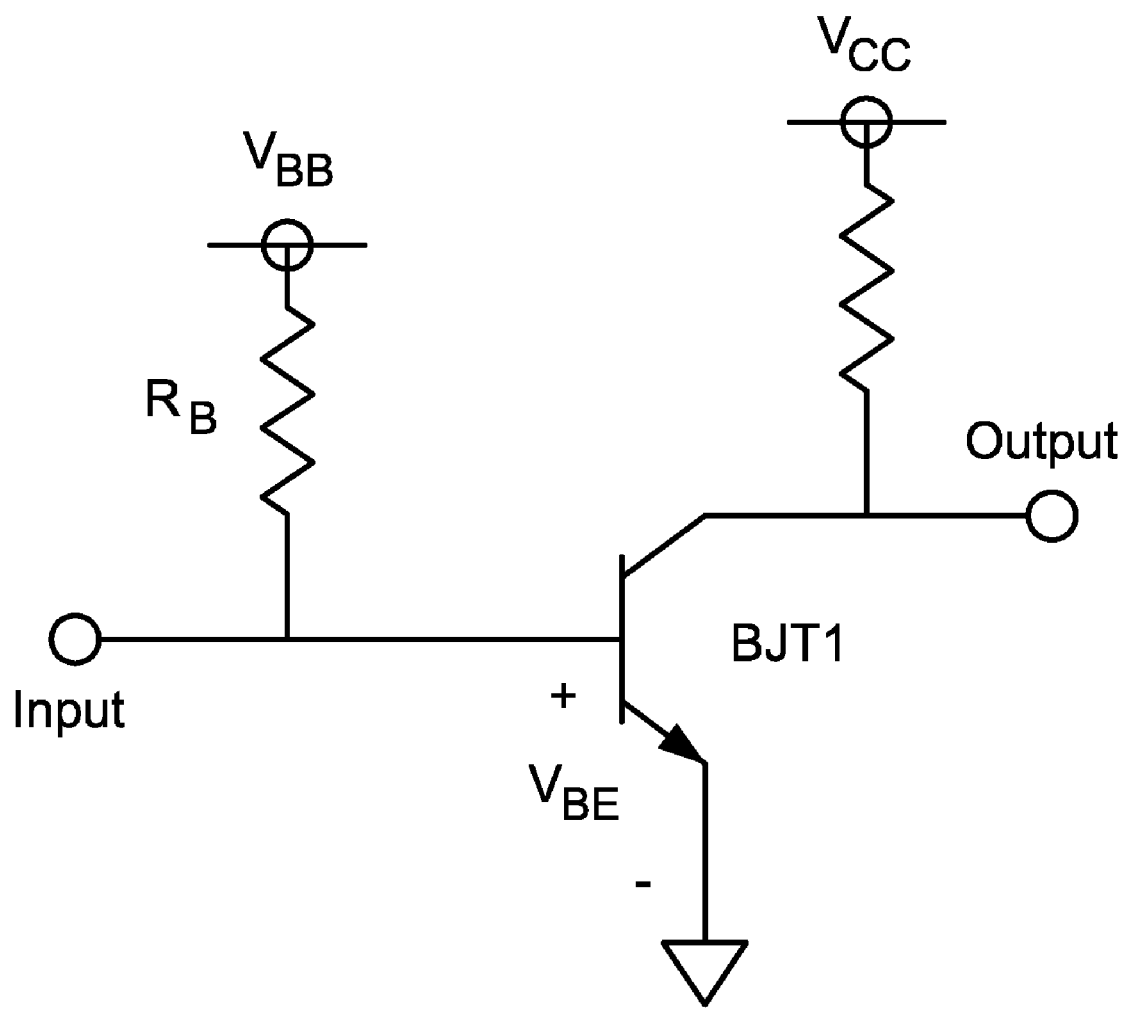
FIG. 1 is a circuit diagram showing a RF amplifier according to the prior art.
Figure 2:
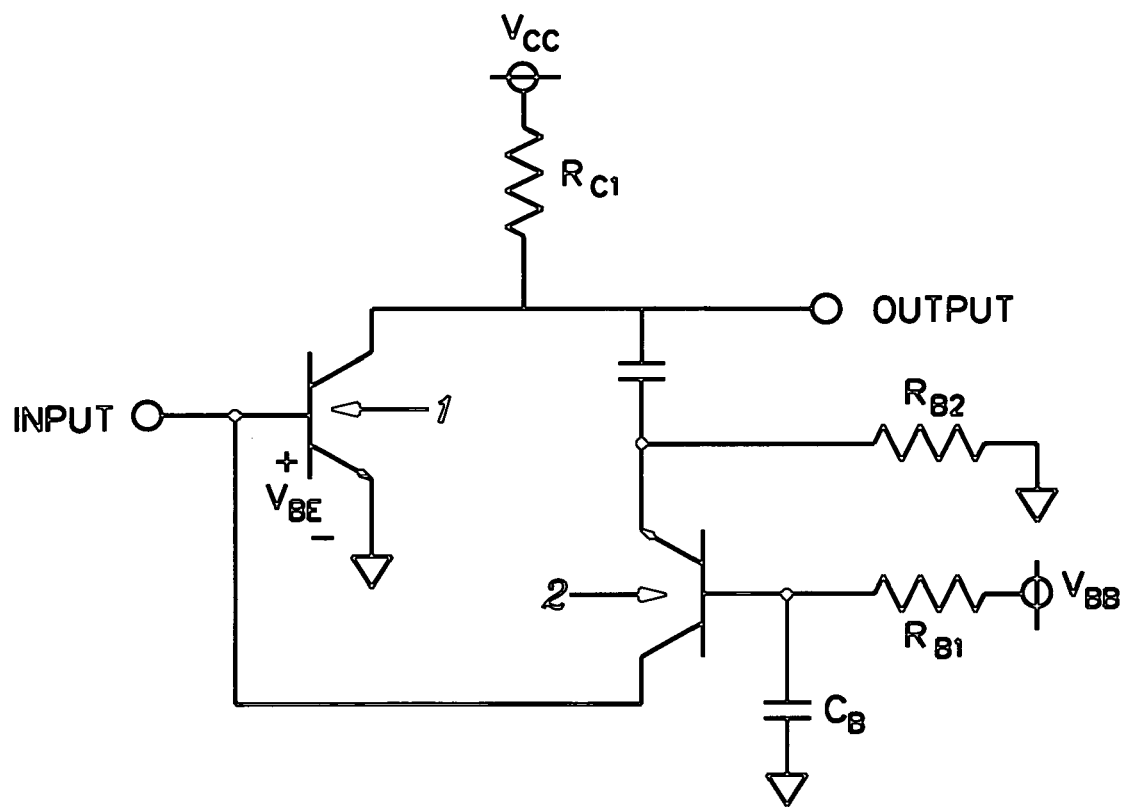
FIG. 2 is a circuit diagram showing the basic topology of a RF amplifier according to an embodiment of the invention.

FIG. 2 shows the basic circuit design of a preferred embodiment of the invention and comprises a reconfigurable transistor pair in which a first transistor 1 provides the amplification, and a second transistor 2 provides distortion compensation. The reconfigurable transistor pair provides two signal paths, a main path for amplification passing through transistor 1, and a second path through transistor 2 that provides distortion compensation. In the embodiment shown in FIG. 1 the transistors 1,2 are identical NPN transistors, though they could also be PNP transistors. As will be discussed in more detail below an important aspect of the present invention is that the three terminals of the second transistor are used to provide three different types of distortion compensation techniques and thus three distortion techniques may be integrated in the one RF amplifier. In particular the base-collector junction of transistor 2 provides pre-distortion compensation, the base-emitter junction of transistor 2 provides post-distortion compensation, while the collector-emitter junction provides cubic-polynomial distortion compensation, These three distortion compensation techniques will now be discussed in turn.

Pre-Distortion

While transistor 1 provides amplification, pre-distortion compensation is provided by the combination of the forward-biased base-collector diode of transistor 2 together with resistor $R_{B1}$ and capacitor $C_B$. When the input power increases the incident RF signal to both transistors 1,2 becomes larger. Distortion would occur because of the voltage drop between the base-emitter junction of transistor 1, but in the embodiment of the invention shown in FIG. 1 this can be compensated for by the increase of the voltage drop between the base-collector junction of transistor 2. The forward-biased base-collector diode of transistor 2, resistor $R_{B1}$ and capacitor $C_B$ form an active biasing circuit and simultaneously form a linearizer for transistor 1 as the pre-distortion path. The magnitude and phase of the pre-distortion can be adjusted by appropriate choices for resistor $R_{B1}$ and capacitor $C_B$ and if desired an inductance can be introduced in the active biasing circuit. An inductance could also be introduced into this biasing circuit.

Figure 3:
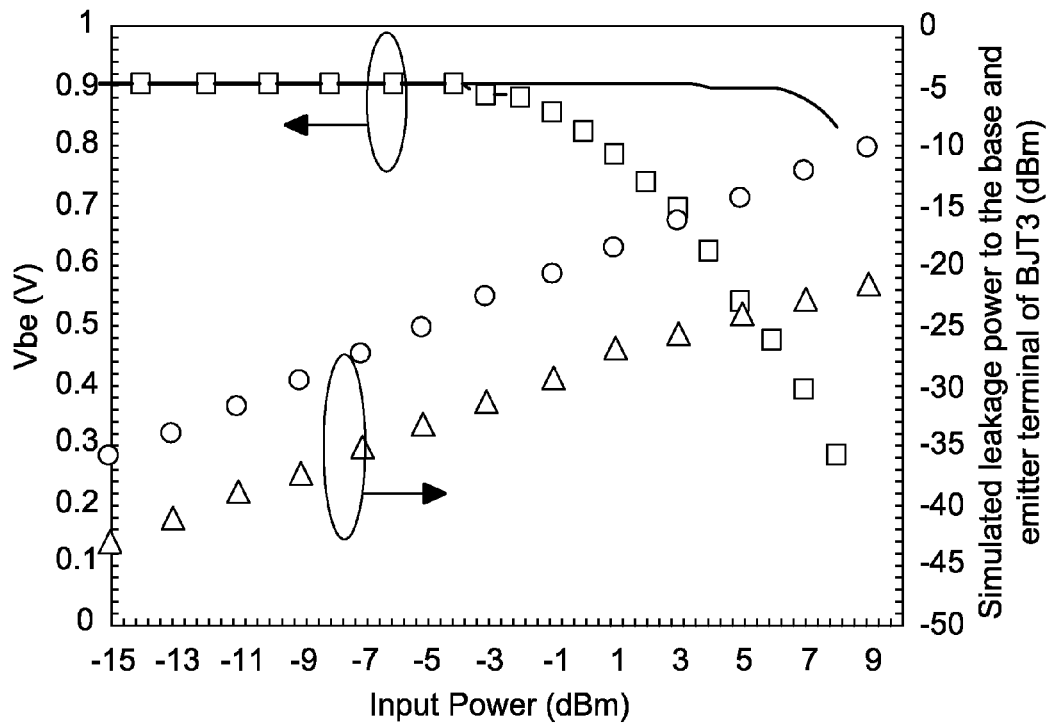
FIG. 3 is a graph showing the effect of the pre-distortion technique of an amplifier according to an embodiment of the invention.

FIG. 3 plots on the left-hand y-axis $V_{BE}$ for the transistor of the prior art (FIG. 1) (open squares) and the transistor 1 of FIG. 2 (solid line) as a function of input power. These results show that in the prior art $V_{BE}$ starts to fall off at about —5 dBm input power, whereas $V_{BE}$ of transistor 1 of the embodiment of the present invention remains constant up to about 7 dBm, ie an improvement of about 12 dB.

The right-hand y-axis of FIG. 3 shows the power leakage from the emitter terminal of transistor 2 (open circles) and the base terminal of transistor 2 (open triangles) and it can be seen that the power leakage is low even at a high input power and so there is no significant power leakage through transistor 2 that might comprise efficiency.

Post-Distortion

While the pre-distortion technique described above may be effective to minimize non-linear distortion in signal amplitude, there will also be phase distortion (largely attributable to variation of $C_{BC}$ during the device operating cycle over its loadline) for which pre-distortion alone may not be able to compensate. To provide further distortion compensation, especially phase distortion compensation, the base-emitter junction of transistor 2 is connected to the output of the amplifier and is used to provide post-distortion.

Figure 4:
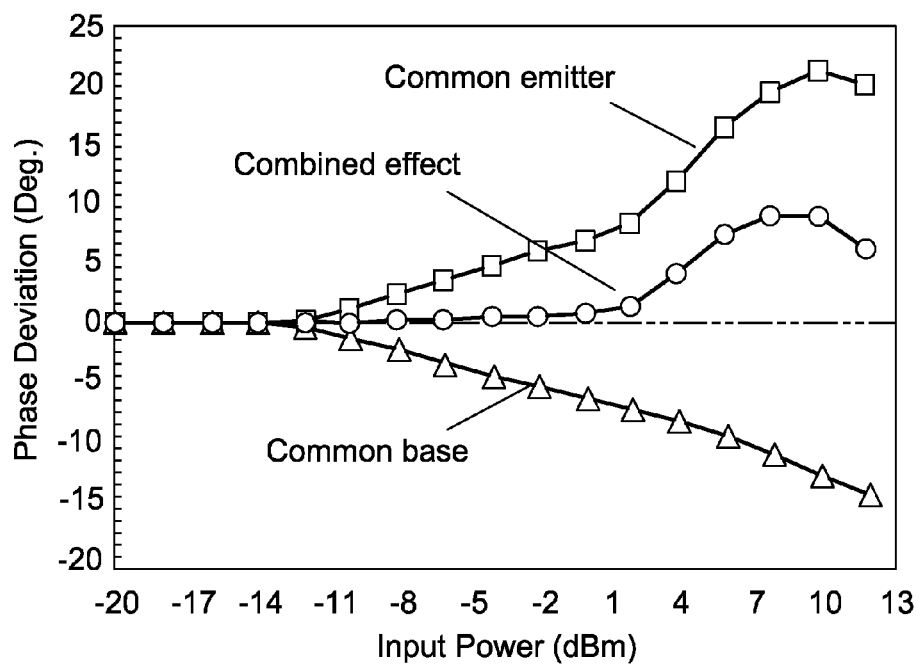
FIG. 4 is a graph showing the effect of the post-distortion technique of an amplifier according to an embodiment of the invention.

The common emitter of transistor 1 delivers phase deviation out of phase with the phase deviation of the common base of transistor 2 and their AM-PM conversions near saturation are also expected to have opposite behaviour. As the input power increases, the phase deviation of the common emitter (transistor 1) will increase while the phase deviation of the common base (transistor 2) will decrease. If the phase characteristics of the upper common emitter path and the lower common base path are chosen to match, then the combined phase characteristic will remain relatively constant. This is illustrated in FIG. 4 and it can be seen that the combined effect has minimal phase deviation up to an input power of about 1 dB and reduced phase deviation compared to the common emitter even at higher input powers.

Cubic-Polynomial Distortion Compensation

The aim of a cubic-polynomial distorter is to eliminate third-order distortion by means of an additional correctly-phased cubic component to the output signal. In the embodiment of the present invention shown in FIG. 2 the input signal splits into two paths: one passing to the amplifying transistor 1 and the other to the transistor 2 that provides pre-distortion and post-distortion compensation as discussed above. Using the non-linearity of the collector-emitter junction of the transistor 2 a well-matched cubic distorter can be provided. By appropriately selecting the phase and amplitude of the lower path through transistor 2, it is possible to make these additional IMD products equal in magnitude and 180 degrees out of phase with the third-order IMD products generated by the upper path through the amplifying transistor 1.

It will thus be seen that in preferred embodiments of the invention it is possible to provide a RF amplifier with pre-distortion, post-distortion and cubic-polynomial distortion compensation integrated into a single circuit by the addition of a second transistor. This design provides high efficiency, a highly linear output and requires only small additional space on the printed circuit board for the second transistor. The three distortion compensation techniques are provided by using respectively the base-collector junction, the base emitter junction and the collector-emitter junctions of the second transistor. A main signal path for amplification is provided through transistor 1, while a second signal path providing distortion compensation passes through transistor 2.

The performance of the RF amplifier described above will be enhanced if a power management control system is also applied. For example, an amplifier according to the topology described above may achieve power added efficiency (PAE) as high as 60% at maximum peak power (say 22 dBm), but the efficiency of the RF amplifier will decrease when the output power is decreased (as would commonly be encountered in both urban and rural use situations where the amplifier normally operates at about 10–15 dB from peak power) and falls to about 5% PAE at about 15 dBm output power. It is preferable therefore to also provide control circuitry to adapt the amplifier bias in accordance with the anticipated output power to maximize the efficiency of the amplifier.

Figure 5:
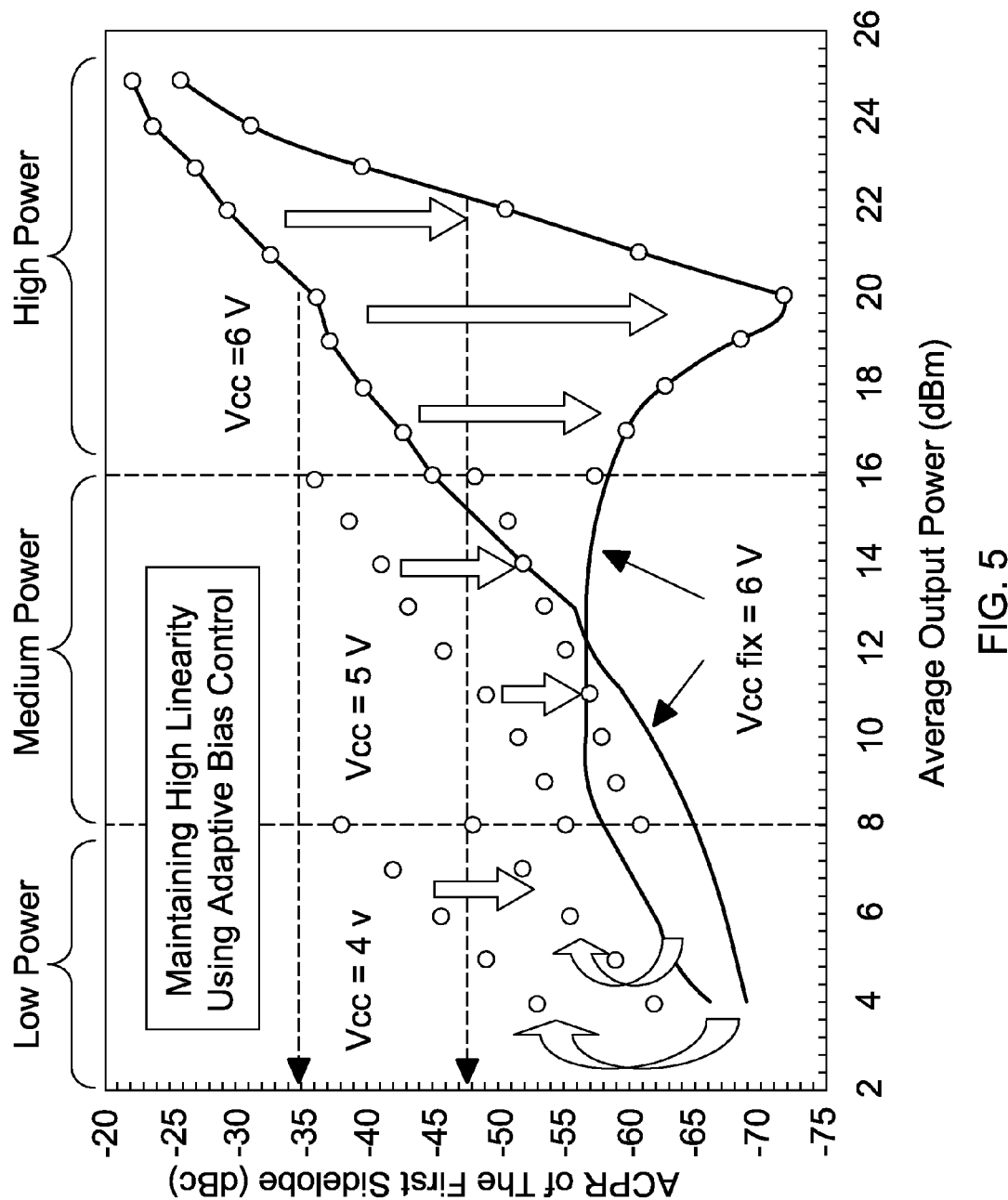
FIG. 5 is a plot illustrating low, medium and high power bands in a power control management system as may be applied in an embodiment of the invention.

This may be achieved by dividing the output power into different bands and selecting appropriate bias voltages for each band, and selecting the appropriate band based upon the sensed input signal. In one typical example, as shown for example in FIG. 5 there may be three bands: low power corresponding to an average output power of less than 8 dBm; medium power 8 dBm to 16 dBm; and high power greater than 16 dBm. In turn these three bands may correspond to applied bias voltages $V_{CC}$ of 4V, 5V and 6V respectively.

Figure 6:
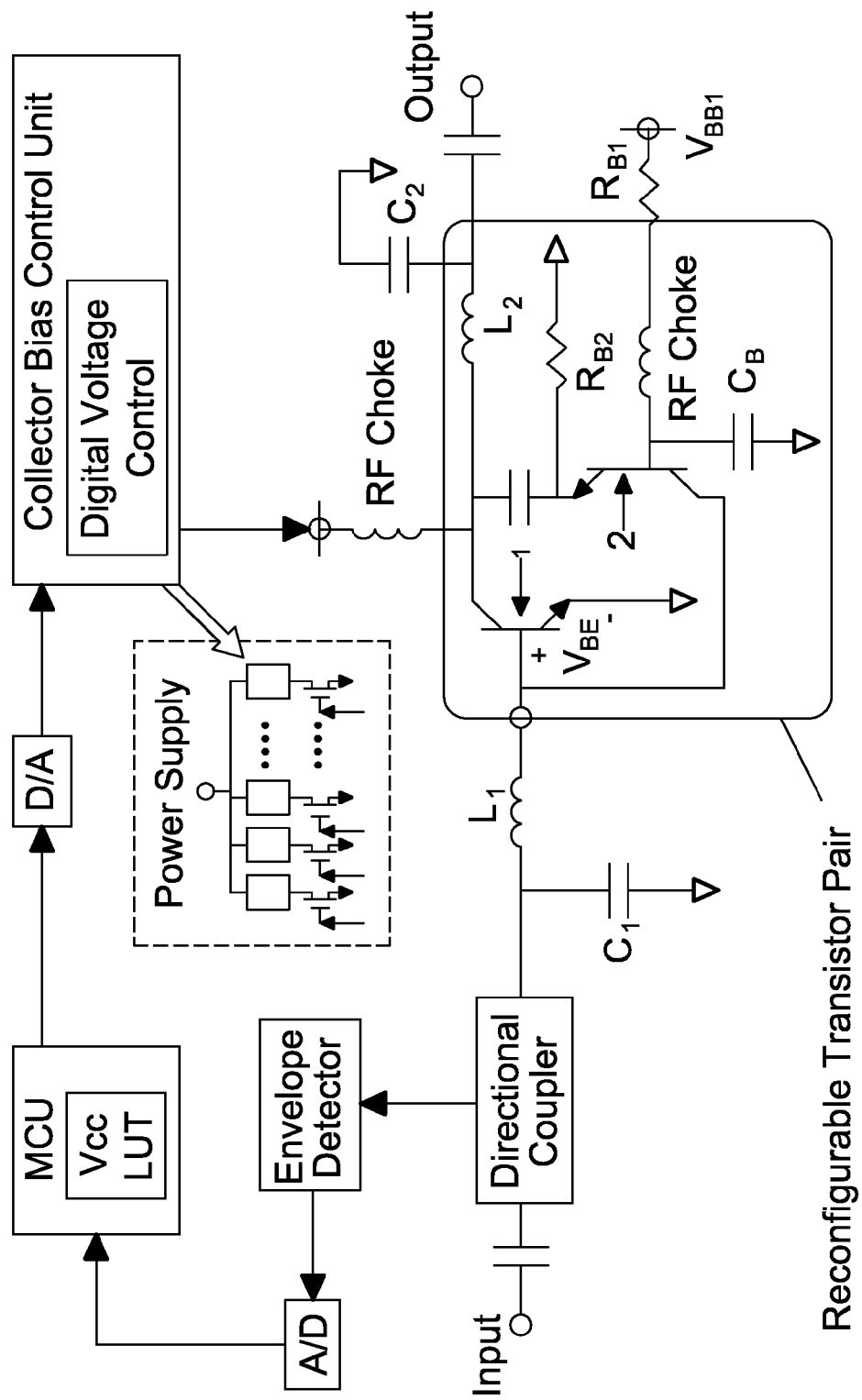
FIG. 6 is a block diagram showing an amplifier according to an embodiment of the invention provided with power management control.

FIG. 6 shows control circuitry for implementing power management control in accordance with this embodiment of the invention. The input signal is sensed and when the power limit for one range is reached in response to the need for increased linearity, the amplifier is switched into the next higher range by increasing the collector bias $V_{CC}$ using a digital voltage control 10 that receives a command from a microprocessor control unit 11.

Figure 7:
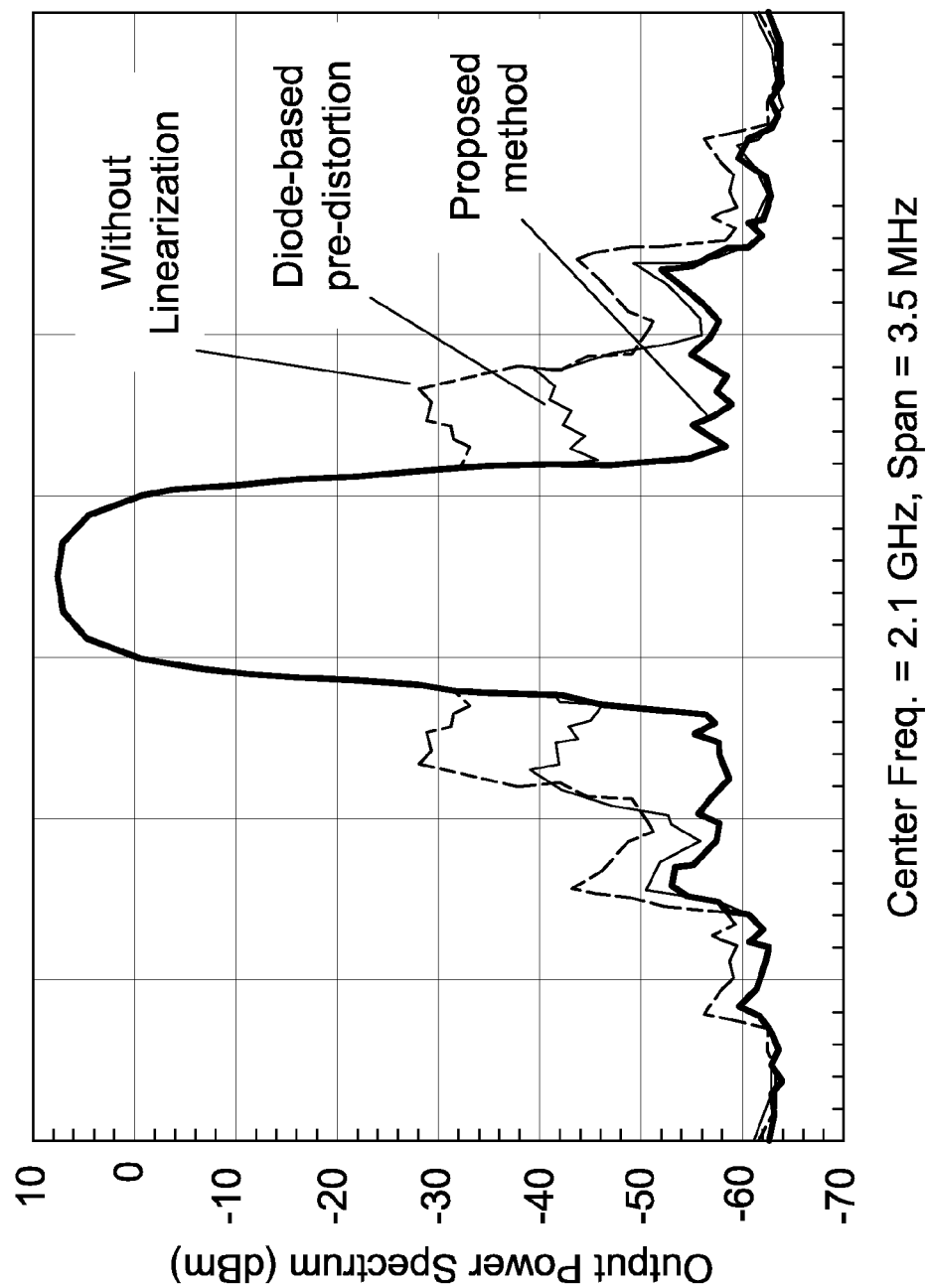
FIG. 7 is a plot comparing the performance of an amplifier according to an embodiment of the invention with a reference amplifier without linearization and a prior art amplifier with diode-based pre-distortion only, FIG. 8 plots the measured transducer gains and adjacent channel power ratios of an amplifier according to an embodiment of the invention with a reference amplifier without linearization and a prior art amplifier with diode-based pre-distortion only.
Figure 8:
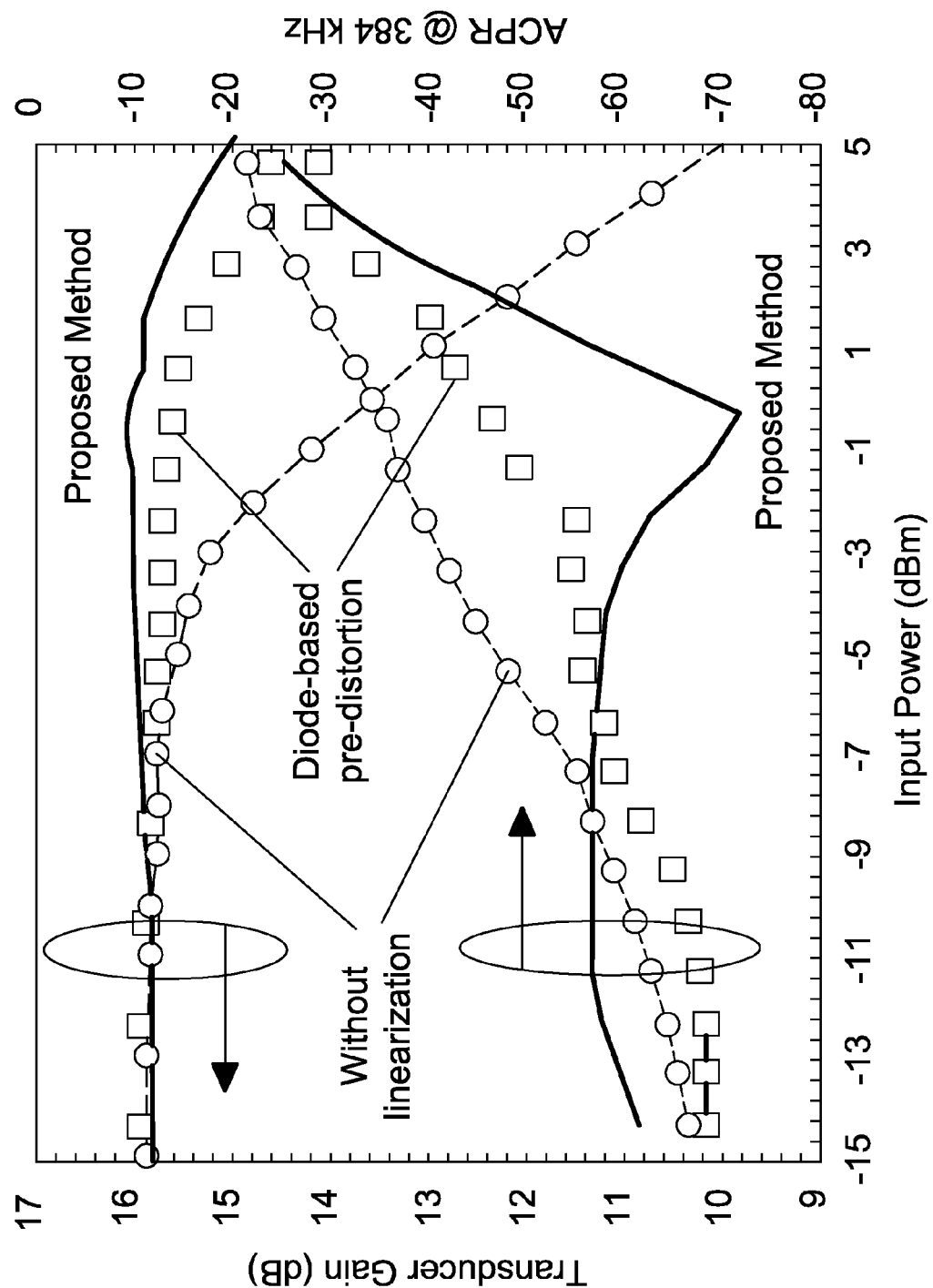

For comparison purposes, an amplifier according to an embodiment of the invention was fabricated and compared with prior art amplifiers. The amplifier according to an embodiment of the invention was fabricated using two commercial NPN silicon BJT transistors (Infineon BFP450) with a typical transition frequency of 25 GHz. The transistor was biased with a supply voltage of 5V and a collector current of 30 mA. For comparison an amplifier with only diode-based predistortion and a reference amplifier with no distortion compensation were also fabricated. All designs were then tested using two sets of common modulation formats: (a) 384-kbps Japanese PHS standard with π/4 quadrature phase-shift keying (QPSK), and (b) 4.096 Mbps 3G W-CDMA standard with uplink QPSK modulation. Results are shown for the former in FIG. 7. A significant improvement in the spectral re-growth for the first side-lobe can be seen with a difference of 32 dB between the embodiment of the present invention and the reference amplifier, and an improvement of 18 dB between the embodiment of the present invention and the amplifier with diode-based predistortion only. FIG. 8 shows the measured transducer gain and the PHS standard adjacent channel power ration (ACPR) at 384 kHz offset as a function of the average power for all cases. All amplifiers are found to exhibit nearly the same power gain at about 16 dB and the maximum ACPR of the amplifier according to an embodiment of the invention was optimized at an output power of 16 dBm. It can be seen that the output power of the 1-dB gain compression point has increased from 12 to 20 dBm and 17 to 20 dBm compared with the reference amplifier and the diode-based predistortion technique respectively. In addition a substantial reduction in spectral re-growth is achieved over a wide range of output power over 13 dB.

Figure 9:
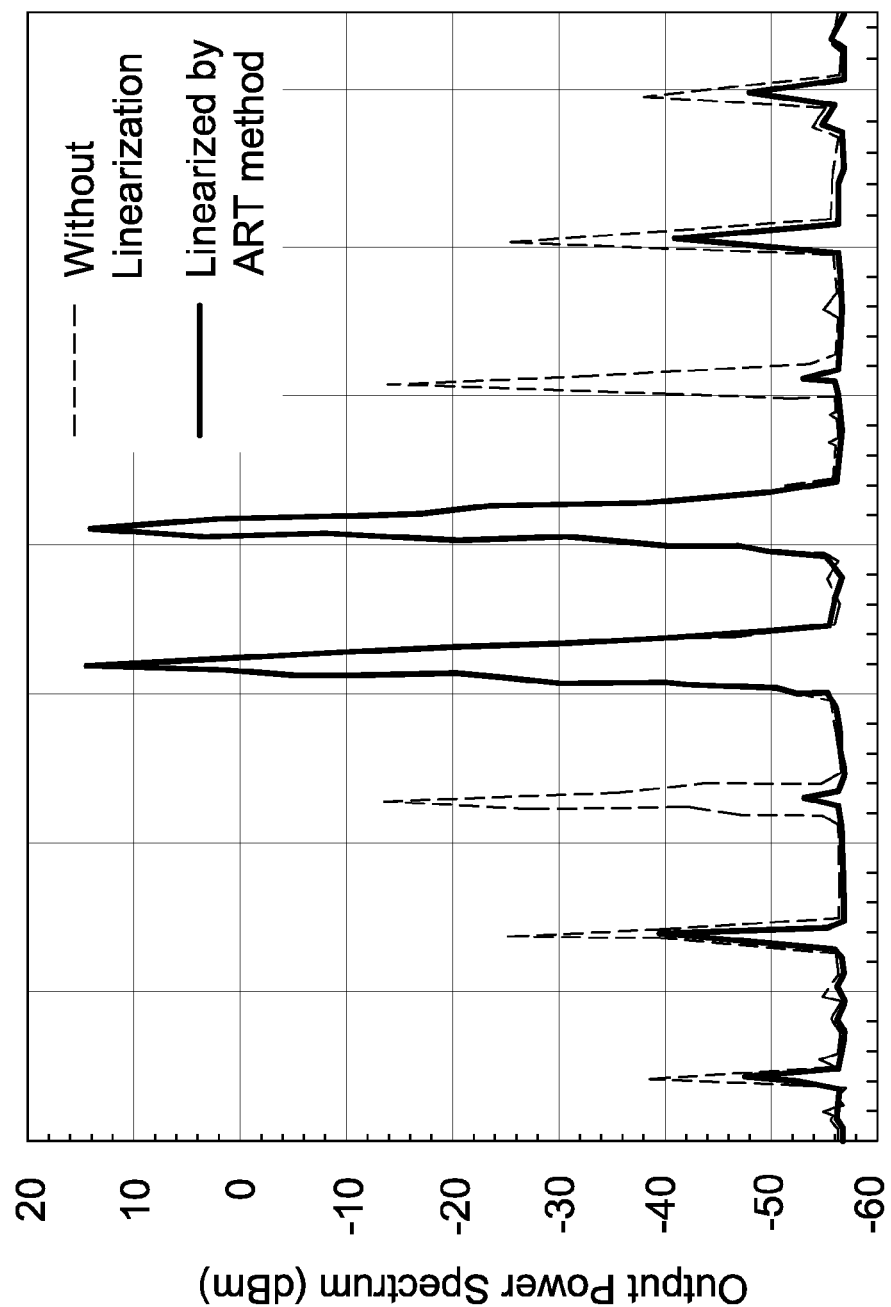
FIG. 9 is a plot of the distortion characteristics of an amplifier according to an embodiment of the present invention with a reference amplifier.

The distortion characteristics of the amplifier according to an embodiment of the invention can also be examined by a standard two-tone test in which signals centered at about 2.1 GHz with 1 MHZ offset were used. The output frequency spectrum of the amplifiers measured at an output power of 15 dBm (including the insertion loss of the power combiner) at each tone is shown in FIG. 9. An improvement of 42 dB is obtained using the amplifier of the present invention with the reference amplifier without linearization.

It will this be seen that the present invention at least in its preferred forms provides a RF amplifier with good linearity and power efficiency. Since the amplifier comprises a reconfigurable transistor pair the space requirement on the PCB is small and the additional power requirements of the linearization are not great. The amplifier would therefore be particularly suitable for handsets in mobile communications apparatus such as wireless phones.

What is claimed is:

1. An amplifier comprising a first transistor for providing signal amplification, and a second transistor for providing distortion compensation, wherein said second transistor is capable of simultaneously providing more than one form of distortion compensation, wherein said second transistor is adapted to provide pre-distortion compensation, post-distortion compensation, and cubic-polynomial compensation, wherein a first junction of said second transistor is used to provide said pre-distortion compensation, wherein a second junction of said second transistor is used to provide said post-distortion compensation, and wherein a third junction of said second transistor is used to provide said cubic-polynomial compensation.

2. An amplifier as claimed in claim 1, wherein said pre-distortion compensation is provided by connecting a first junction of said second transistor to the input to said first transistor whereby a voltage drop at a junction of said first transistor is compensated for by a corresponding voltage drop in the said first junction of the second transistor.

3. An amplifier as claimed in claim 1, wherein said post-distortion compensation is provided by connecting a second junction of said second transistor to the output of said first transistor.

4. An amplifier as claimed in claim 1, wherein a first signal path passes through the first transistor and a second signal path passes through the collector-emitter junction of the second transistor, and wherein said cubic-polynomial distortion compensation is provided by selecting the phase and amplitude of the second signal path such that third-order distortion products of the said signal path are substantially equal in magnitude and opposite in phase to third order distortion products of the first signal path.

5. An amplifier as claimed in claim 1, further comprising a power management control circuit adapted to select a bias voltage for the amplifier in accordance with an anticipated output power.

6. An amplifier as claimed in claim 5, wherein said power management control circuit identifies whether the amplifier is operating in a low power mode, a medium power mode, or a high power mode and adjusts the bias voltage in accordance with the identified operating mode.

7. An amplifier comprising a first signal path and a second signal path, wherein said first signal path passes through a first transistor to provide signal gain, and wherein the second signal path passes through a second transistor to provide distortion compensation, wherein said second transistor provides pre-distortion, post-distortion and cubic-polynomial distortion compensation, wherein a first junction of said second transistor is used to provide pre-distortion compensation, wherein a second junction of said second transistor is used to provide post-distortion compensation, and wherein a third junction of said second transistor is used to provide cubic-polynomial distortion compensation.

8. An amplifier as claimed in claim 7, wherein said pre-distortion compensation is provided by connecting a first junction of said second transistor to the input to said first transistor whereby a voltage drop at a junction of said first transistor is compensated for by a corresponding voltage drop in the said first junction of the second transistor.

9. An amplifier as claimed in claim 7, wherein said post-distortion compensation is provided by connecting a second junction of said second transistor to the output of said first transistor.

10. An amplifier as claimed in claim 7, wherein said cubic-polynomial distortion compensation is provided by selecting the phase and amplitude of the second signal path such that third-order distortion products of the said signal path are substantially equal in magnitude and opposite in phase to third-order distortion products of the first signal path.

11. An amplifier as claimed in claim 7, further comprising a power management control circuit adapted to select a bias voltage for the amplifier in accordance with an anticipated output power.

12. An amplifier as claimed in claim 11, wherein said power management control circuit identifies whether the amplifier is operating in a low power mode, a medium power mode, or a high power mode and adjusts the bias voltage in accordance with the identified operating mode.

* * * * *